(12) United States Patent
Lee et al.

(10) Patent No.: US 11,994,904 B2
(45) Date of Patent: May 28, 2024

(54) DISPLAY DEVICE HAVING ADHESIVE MEMBER AT FOLDING AREA

(71) Applicant: Samsung Display Co., LTD., Yongin-si (KR)

(72) Inventors: Kyung-Mok Lee, Bucheon-si (KR); Hojin Kang, Suwon-si (KR); Minsung Kwon, Hwaseong-si (KR); Dong-Youb Lee, Cheonan-si (KR); Suk-Ho Lee, Incheon (KR); Hirotsugu Kishimoto, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 89 days.

(21) Appl. No.: 16/996,990

(22) Filed: Aug. 19, 2020

(65) Prior Publication Data

US 2021/0055760 A1    Feb. 25, 2021

(30) Foreign Application Priority Data

Aug. 21, 2019   (KR) .................. 10-2019-0102280

(51) Int. Cl.
```
G06F 1/16      (2006.01)
G09G 3/3225    (2016.01)
H10K 50/842    (2023.01)
```
(52) U.S. Cl.
CPC .......... *G06F 1/1616* (2013.01); *G09G 3/3225* (2013.01); *H10K 50/8426* (2023.02)

(58) Field of Classification Search
CPC .................... H01L 51/5246; G09G 3/3225

USPC ......................................................... 257/40
See application file for complete search history.

(56) References Cited

U.S. PATENT DOCUMENTS

| | | | |
|---|---|---|---|
| 9,864,242 B2 | 1/2018 | Lee | |
| 9,985,208 B2 | 5/2018 | Hwang et al. | |
| 10,483,098 B2 | 11/2019 | Um et al. | |
| 10,535,837 B2 | 1/2020 | Chung et al. | |
| 10,783,808 B2 | 9/2020 | Cho et al. | |
| 2015/0147532 A1* | 5/2015 | Nam | B32B 3/263 428/172 |
| 2016/0197300 A1* | 7/2016 | Hwang | H01L 24/75 438/26 |
| 2016/0321024 A1* | 11/2016 | Jin | G06F 3/1446 |
| 2017/0043565 A1* | 2/2017 | Fushimi | B32B 27/32 |
| 2017/0123460 A1* | 5/2017 | Jung | G06F 3/0445 |
| 2017/0278900 A1* | 9/2017 | Yang | H01L 27/3272 |

(Continued)

FOREIGN PATENT DOCUMENTS

| | | |
|---|---|---|
| CN | 108073325 A | 5/2018 |
| CN | 108735783 A | 11/2018 |

(Continued)

*Primary Examiner* — Xia L Cross
(74) *Attorney, Agent, or Firm* — CANTOR COLBURN LLP

(57) ABSTRACT

A display device includes a folding area at which the display device is foldable; a first non-folding area and a second non-folding area opposing each other with the folding area therebetween; a display panel; an adhesive member having a thickness of about 15 micrometers to about 18 micrometers; and a protective film facing the display panel with the adhesive member having the thickness of about 15 micrometers to about 18 micrometers therebetween, the adhesive member coupling the protective film to the display panel.

15 Claims, 10 Drawing Sheets

(56) References Cited

U.S. PATENT DOCUMENTS

| | | | |
|---|---|---|---|
| 2017/0323779 A1* | 11/2017 | Um | G02F 1/13454 |
| 2017/0352834 A1 | 12/2017 | Kim et al. | |
| 2018/0013095 A1* | 1/2018 | Choi | H01L 51/0097 |
| 2018/0032189 A1* | 2/2018 | Lee | G06F 3/0445 |
| 2018/0286939 A1* | 10/2018 | Lee | H01L 27/3276 |
| 2018/0308903 A1 | 10/2018 | Jeong et al. | |
| 2019/0057645 A1 | 2/2019 | Kwon et al. | |
| 2019/0086709 A1* | 3/2019 | Lee | G02F 1/13338 |
| 2019/0207133 A1 | 7/2019 | Park et al. | |

FOREIGN PATENT DOCUMENTS

| | | |
|---|---|---|
| CN | 109584720 A | 4/2019 |
| KR | 1020160084536 A | 7/2016 |
| KR | 1020170125161 A | 11/2017 |
| KR | 1020170125639 A | 11/2017 |

* cited by examiner

US 11,994,904 B2

DISPLAY DEVICE HAVING ADHESIVE MEMBER AT FOLDING AREA

This U.S. non-provisional patent application claims priority to Korean Patent Application No. 10-2019-0102280, filed on Aug. 21, 2019, and all the benefits accruing therefrom under 35 U.S.C. § 119, the entire contents of which are hereby incorporated by reference.

BACKGROUND

(1) Field

The present disclosure herein relates to a display device, and more particularly, to a display device capable of reducing a failure thereof.

(2) Description of the Related Art

Various display devices used in electronic multimedia devices such as televisions, portable phones, tablet computers, navigation systems and game consoles have been developed. The types or forms of display devices have been changed to match the uses of multimedia devices.

Various types of flexible display devices have been developed. For example, rollable, foldable and stretchable display devices have been developed. Unexpected failures may occur depending on the types of display devices.

SUMMARY

One or more embodiment provides a display device for which a failure (or defects) at a folding area thereof is reduced.

One or more embodiment also provides a display device in which a chip-on-plastic ("COP") structure can be applied in mounting electronic components, with reduced failure.

In an embodiment, a display device includes a folding area at which the display device is foldable; a first non-folding area and a second non-folding area opposing each other with the folding area therebetween; a display panel; an adhesive member having a thickness of about 15 micrometers (μm) to about 18 μm; and a protective film facing the display panel with the adhesive member having the thickness of about 15 micrometers to about 18 micrometers therebetween, the adhesive member coupling the protective film to the display panel.

In an embodiment, the protective film may include polyimide.

In an embodiment, the adhesive member may include an acrylic material.

In an embodiment, the acrylic material may include at least one of butyl acrylate, ethyl acrylate and acrylic acid.

In an embodiment, the display device may further include a driving chip mounted on the display panel.

In an embodiment, the driving chip may be disposed on in the second non-folding area.

In an embodiment, the display device may further include a display area in which an image is displayed, and a non-display area adjacent to the display area, and the driving chip which is in the second non-folding area, may be in the non-display area.

In an embodiment, the driving chip may be mounted directly on the display panel.

In an embodiment, the adhesive member may couple the display panel and the protective film to each other in the first non-folding area, the second non-folding area and the folding area.

In an embodiment, a thickness of the display panel may range from about 35 μm to about 40 μm.

In an embodiment, a thickness of the protective film may range from about 47 μm to about 52 μm.

In an embodiment of the invention, a display device may include a display panel including a driving chip directly mounted thereto; an adhesive member including acrylic and having a thickness of about 15 μm to about 18 μm; and a protective film including polyimide, which faces the display panel having the driving chip directly mounted thereto, with the adhesive member including acrylic and having the thickness of about 15 μm to about 18 μm therebetween, the adhesive member coupling the display panel to the protective film.

In an embodiment, the display panel may include a polyimide substrate.

In an embodiment, the protective film may be disposed on a bottom surface of the polyimide substrate.

In an embodiment, the thickness of the adhesive member may range from about 16 μm to about 17 μm.

In an embodiment, a thickness of the protective film may be about 50 μm.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
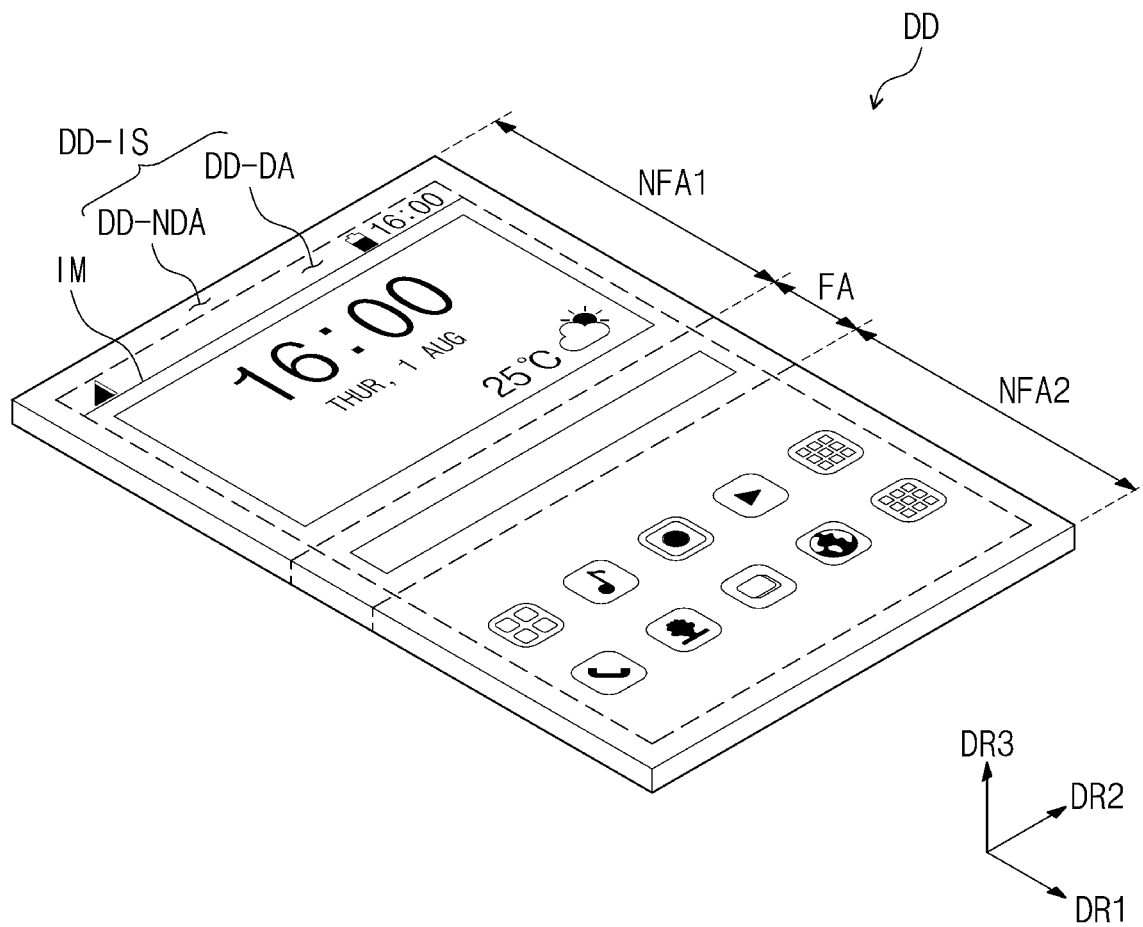
FIGS. 1A to 1C are perspective views illustrating embodiments of a display device.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being related to another element such as being "on" another element, it can be directly on the other element or intervening elements may be present. In contrast, when an element such as a layer, region or substrate is referred to as being related to another element such as being "directly on" another element, it means that there are no intervening elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of embodiments.

Figure 1B:
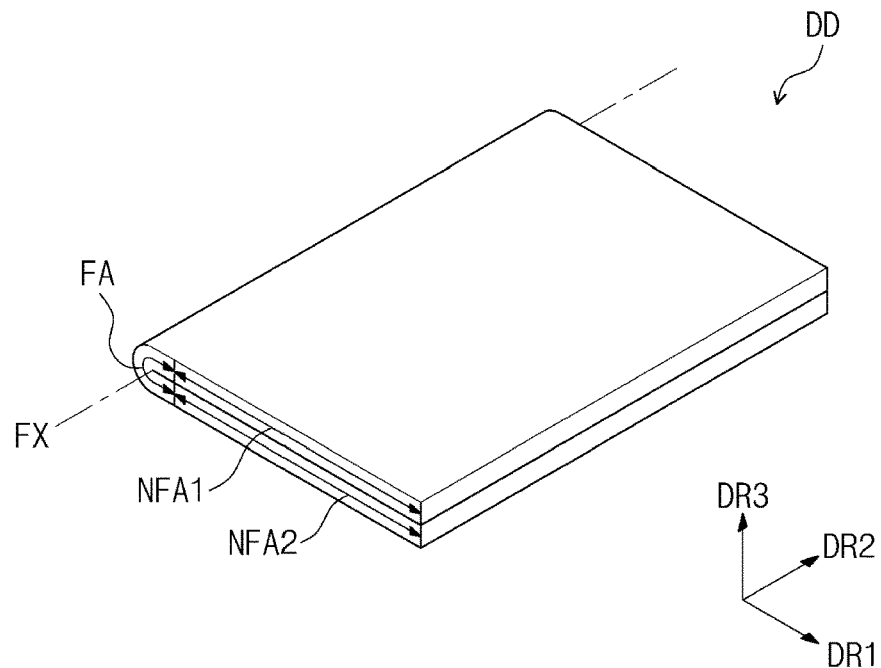
Figure 1C:
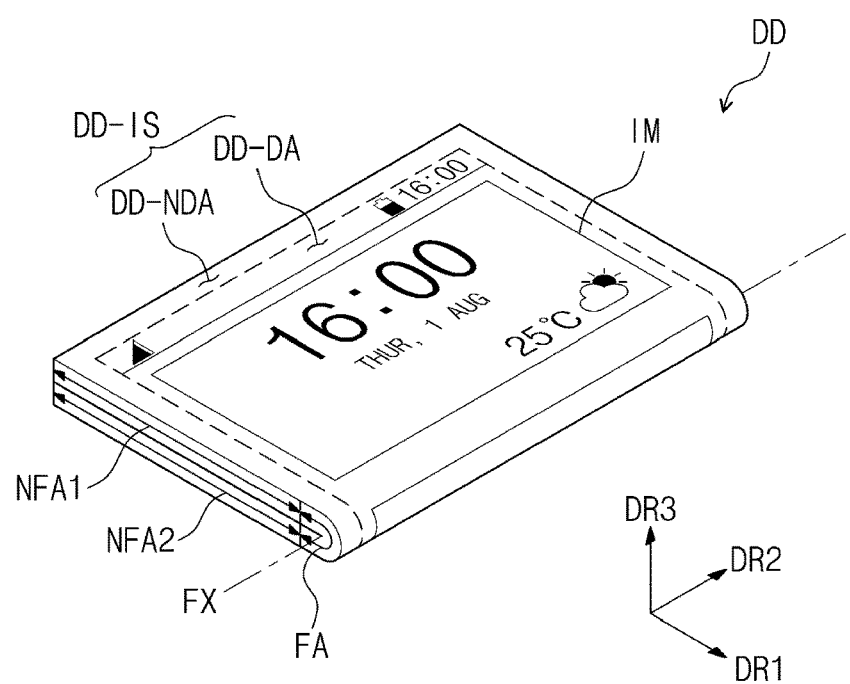

FIGS. 1A to 1C are perspective views illustrating an embodiment of a display device DD. As illustrated in FIG. 1A, a display device DD may display an image IM through a display surface DD-IS. The display surface DD-IS may be disposed in a plane which is parallel to a plane defined by a first direction DR1 and a second direction DR2 which cross each other. A normal direction relative to the display surface DD-IS (e.g., a thickness direction of the display device DD) may be indicated by a third direction DR3.

A front surface (or a top surface) and a rear surface (or a bottom surface) of each of members or units described hereinafter may be defined with reference to the third direction DR3. However, the first to third directions DR1, DR2 and DR3 of the present embodiment are illustrated as an example. Hereinafter, first to third directions DR1, DR2 and DR3 are defined as directions indicated by the first to third directions DR1, DR2 and DR3 of the present embodiment, respectively.

As illustrated in FIG. 1A, the display surface DD-IS may include a display area DD-DA in which the image IM is displayed, and a non-display area DD-NDA adjacent to the display area DD-DA. An image may not be displayed in the non-display area DD-NDA. In FIG. 1A, icon images are illustrated as an example of the image IM. The display device DD and components thereof may have a display area DD-DA and a non-display area DD-NDA adjacent to the display area DD-DA, respectively corresponding to those described above related to the display surface DD-IS.

As illustrated in FIG. 1A, the display area DD-DA may have a quadrilateral shape (e.g., a rectangular shape) in a top plan view. The non-display area DD-NDA may surround the display area DD-DA. However, embodiments of the inventive concepts are not limited thereto. The shapes of the display area DD-DA and the non-display area DD-NDA may be variously designed.

As illustrated in FIGS. 1A to 1C, the display device DD may include a plurality of areas defined according to an operation mode of the display device DD. The display device DD may include a first area NFA1, a second area NFA2, and a third area FA disposed between the first area NFA1 and the second area NFA2. The third area FA may be an area that is foldable with respect to a folding axis FX (e.g., a folding area) and substantially forms a curvature. The first area NFA1 and the second area NFA2 may be an area that is not foldable and/or remains substantially flat (e.g., non-folding area) even when third area FA is folded. Hereinafter, the first area NFA1, the second area NFA2 and the third area FA may be referred to as a first non-folding area NFA1, a second non-folding area NFA2 and a folding area FA, respectively. The display device DD and components thereof may be foldable at the folding area FA, and may be non-foldable or remain flat at the first non-folding area NFA1 and/or the second non-folding area NFA2. The first non-folding area NFA1 and a second non-folding area NFA2 are disposed opposing each other with the folding area FA therebetween.

As illustrated in FIG. 1B, the display device DD may be inner-folded or in-folded in such a way that the display surface DD-IS of the first non-folding area NFA1 faces the display surface DD-IS of the second non-folding area NFA2. That is, the display device DD which is in-folded disposes a portion of the display surface DD-IS at the first non-folding area NFA1 facing a portion of the display surface DD-IS at the second non-folding area NFA2. As illustrated in FIG. 1C, the display device DD may be outer-folded or out-folded in such a way that the display surface DD-IS is exposed to the outside. That is, the display device DD which is out-folded disposes a portion of the display surface DD-IS at the first non-folding area NFA1 facing away from a portion of the display surface DD-IS at the second non-folding area NFA2.

In an embodiment, the display device DD may include the folding area FA provided in plural (e.g., a plurality of the folding areas FA). In an embodiment, the folding area FA may be defined to correspond to a manner in which a user operates the display device DD. In an embodiment, for example, unlike FIGS. 1B and 1C, the folding area FA may be defined in parallel to the first direction DR1 or may be defined in a diagonal direction which is inclined with respect to the first direction DR1 and/or the second direction DR2. A planar area (e.g., dimension or size) of the folding area FA may not be fixed but may be determined depending on a radius of curvature formed by folding of the display device DD at the folding area FA. In embodiments, the display device DD may repeatedly operate only in the operation modes illustrated in FIGS. 1A and 1B or may repeatedly operate only in the operation modes illustrated in FIGS. 1A and 1C. The display device DD which is foldable is illustrated in the present embodiment. However, the invention is not limited thereto. In embodiments, the display device DD may be a different one of the display device DD which is flexible according to different operation modes.

The display device DD which can be applied to a mobile phone as an electronic device is illustrated as an example in the present embodiment. Even though not shown in the drawings, electronic modules, a camera module and a power module, which are mounted on a main board, may be disposed together with the display device DD in a bracket and/or a case to constitute an electronic device such as the mobile phone. The display device DD according to one or more embodiment may also be applied to relatively large-sized electronic devices (e.g., televisions and monitors) and relatively small and middle-sized electronic devices (e.g., tablets, car navigation units, game consoles, and smart watches).

FIGS. 2A to 2F are cross-sectional views illustrating embodiments of a display device DD. FIGS. 2A to 2F illustrate cross sections defined along the second direction DR2 and the third direction DR3. FIGS. 2A to 2F simply illustrate functional panels and/or functional units of a display device DD as components thereof to describe stacking relationship of the functional panels and/or the functional units.

The display device DD according to an embodiment may include a display unit, an input sensing unit, an anti-reflection unit, and a window unit. One or more the display unit, the input sensing unit, the anti-reflection unit and the window unit may be integral with each other such as by forming thereof by continuous processes in a method of manufacturing the display device DD, or may be separately provided from each other in different processes and subsequently coupled to each other such as by a coupling member. In FIGS. 2A to 2F, an optically clear adhesive member OCA is illustrated as an example of the coupling member. The coupling member described hereinafter may include a pressure sensitive adhesive, an adhesive known in the art or glue. In an embodiment, the optically clear adhesive member OCA may have a thickness of about 15 micrometers (µm) to about 18 µm. In embodiments, the anti-reflection unit and the window unit may be replaced with one or more other component or may be omitted.

In FIGS. 2A to 2F, at least one of the input sensing unit, the anti-reflection unit and the window unit, which is integrally formed with another component by continuous processes, may be represented as a "layer". At least one of the input sensing unit, the anti-reflection unit and the window unit, which is provided separately and subsequently coupled to another component such as by the coupling member, may be represented as a "panel". The "panel" may include a base layer BL providing a base surface within a particular unit or component. In an embodiment, for example, the base layer BL may be a synthetic resin film, a composite material film or a glass substrate. The "layer" may not include a base layer BL. In other words, the unit or component which represented as the "layer" may be disposed on a base surface defined by another unit or component.

When the display unit, input sensing unit, the anti-reflection unit and the window unit respectively include a base layer BL, they may be referred to as a display panel DP, an input sensing panel ISP, an anti-reflection panel RPP, and a window panel WP. When the input sensing unit, the anti-reflection unit and the window unit respectively do not include a base layer BL, they may be referred to as an input sensing layer ISL, an anti-reflection layer RPL, and a window layer WL.

Figure 2A:
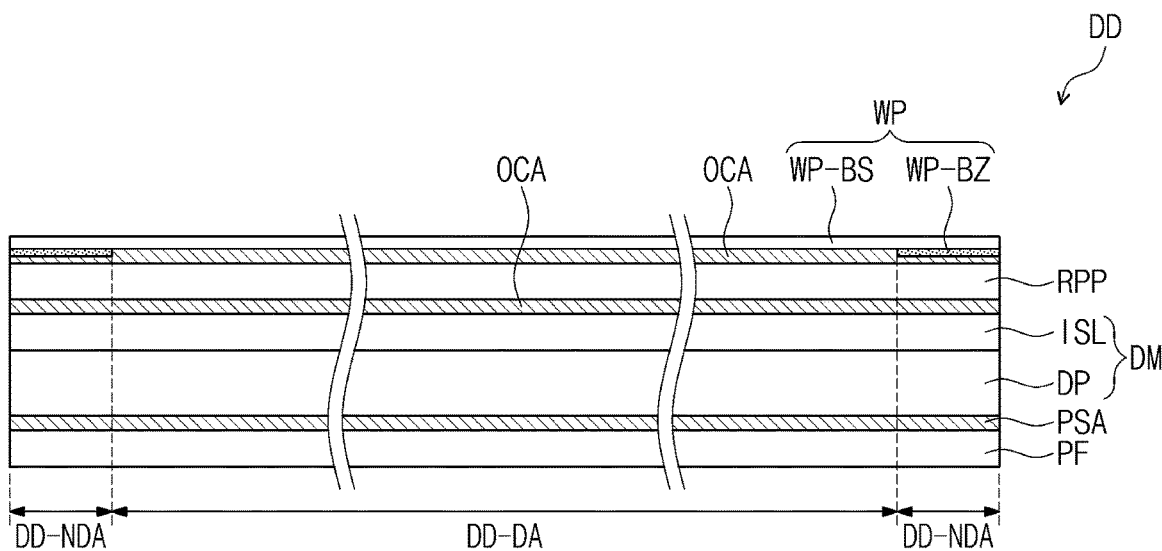
FIGS. 2A to 2F are cross-sectional views illustrating embodiments of a display device.

As illustrated in FIG. 2A, the display device DD may include the display panel DP, the input sensing layer ISL, the anti-reflection panel RPP and the window panel WP. The input sensing layer ISL may be disposed directly on the display panel DP. In the present specification, it is understood that when a component 'B' is disposed directly on a component 'A', an additional adhesive layer/adhesive member is not disposed between the component 'A' and the component 'B'. In other words, the term "directly" means that there are no intervening components. After formation of the component 'A', the component 'B' is formed on a base surface, provided by the component 'A', through continuous processes.

The display panel DP and the input sensing layer ISL disposed directly on the display panel DP may together define a display module DM. The optically clear adhesive member OCA may be provided in plural (e.g., optically clear adhesive members OCA) between the display module DM and the anti-reflection panel RPP and between the anti-reflection panel RPP and the window panel WP, respectively.

The display panel DP may generate an image, generate light, emit light, etc., and the input sensing layer ISL may obtain coordinate information of an external input (e.g., a touch event) to the display device DD. The display device DD may further include a protective film PF disposed on a bottom surface of the display panel DP. The protective film PF and the display panel DP may be coupled to each other through a coupling member such as an adhesive member PSA. Here, the adhesive member PSA may include a pressure sensitive adhesive.

Each display device DD of FIGS. 2B to 2F described below may also include the protective film PF. The protective film PF may protect the display panel DP from an external impact. The protective film PF may include a material known in the art without limitation. In an embodiment, for example, the protective film PF may be a polyimide ("PI") film. In an embodiment, for example, the protective film PF may be a flexible film. When the protective film PF includes or is formed of polyimide ("PI"), separation or defects of an interface in the folding area FA of the display device DD which is flexible or foldable may be reduced as compared with the protective film PF including or formed of another material. This will be described later in detail with reference to FIGS. 6A to 6C.

The display panel DP may be, but not limited to, a light emitting type display panel. In an embodiment, for example, the display panel DP may be an organic light emitting display panel or a quantum-dot light emitting display panel. An emission layer of the organic light emitting display panel may include an organic light emitting material. An emission layer of the quantum-dot light emitting display panel may include quantum dots and/or quantum rods. Hereinafter, the display panel DP which is the organic light emitting display panel will be described as an example.

The anti-reflection panel RPP may reduce a reflectance of external light incident on and through the window panel WP. The anti-reflection panel RPP may include a retarder and a polarizer. The retarder may be a film type or a liquid crystal coating type and may include a $\lambda/2$ retarder and/or a $\lambda/4$ retarder. The polarizer may also be a film type or a liquid crystal coating type. The film type may include an elongated synthetic resin film, and the liquid crystal coating type may include arranged liquid crystals. The anti-reflection panel RPP may further include a protective layer or film. The retarder and/or the polarizer may be defined as a base member or layer of the anti-reflection panel RPP, or the protective layer or film may be defined as the base member or layer of the anti-reflection panel RPP.

The anti-reflection panel RPP may include color filters. The color filters may be arranged in a predetermined form. The arrangement of the color filters may be determined in consideration of light emitting colors of pixels PX included in the display panel DP. The anti-reflection panel RPP may further include a black matrix adjacent to the color filters.

The window panel WP may include a base film WP-BS and a light blocking pattern WP-BZ. The base film WP-BS may include a glass substrate and/or a synthetic resin film. The base film WP-BS is not limited to a single layer. The base film WP-BS may include two or more films coupled to each other by a coupling member such as an adhesive layer.

The light blocking pattern WP-BZ may overlap with a portion of the base film WP-BS. The light blocking pattern WP-BZ may be disposed on a rear surface of the base film WP-BS to define or correspond to a bezel area (e.g., the non-display area DD-NDA of FIG. 1A) of the display device DD.

The light blocking pattern WP-BZ may be a colored organic layer and may be provided or formed by, for example, a coating method. Even though not shown in the drawings, the window panel WP may further include a functional coating layer disposed on a front surface of the base film WP-BS. The functional coating layer may include at least one of an anti-fingerprint layer, an anti-reflection layer and a hard coating layer.

In FIGS. 2B to 2F, the window panel WP and the window layer WL are simply illustrated without distinguishing the base film WP-BS and the light blocking pattern WP-BZ for the purpose of ease and convenience in illustration.

Figure 2B:
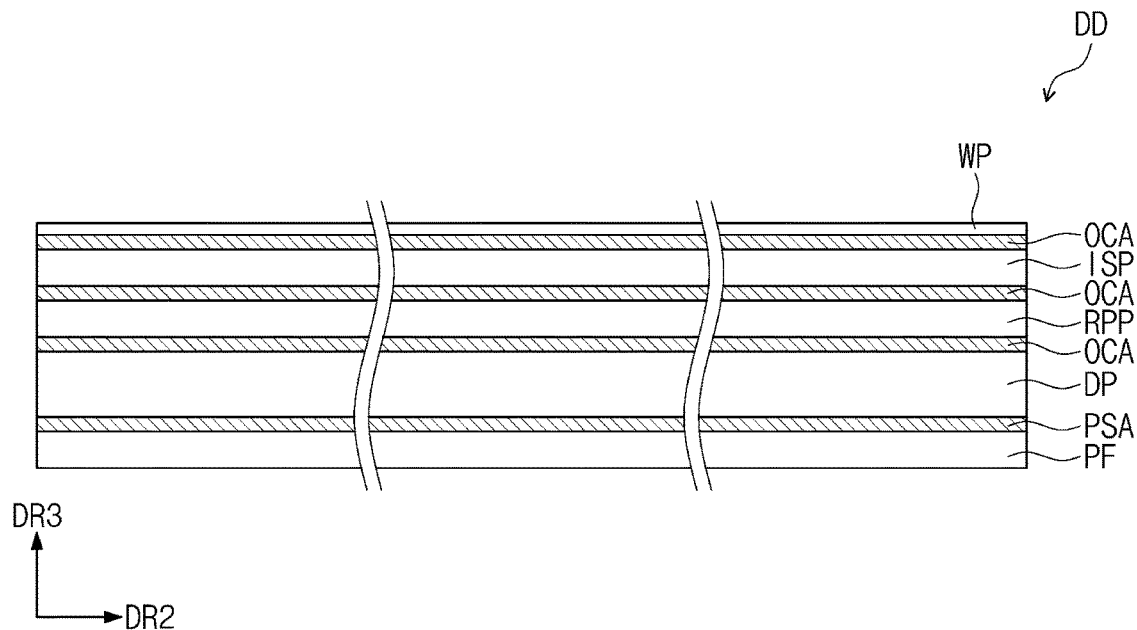
Figure 2C:
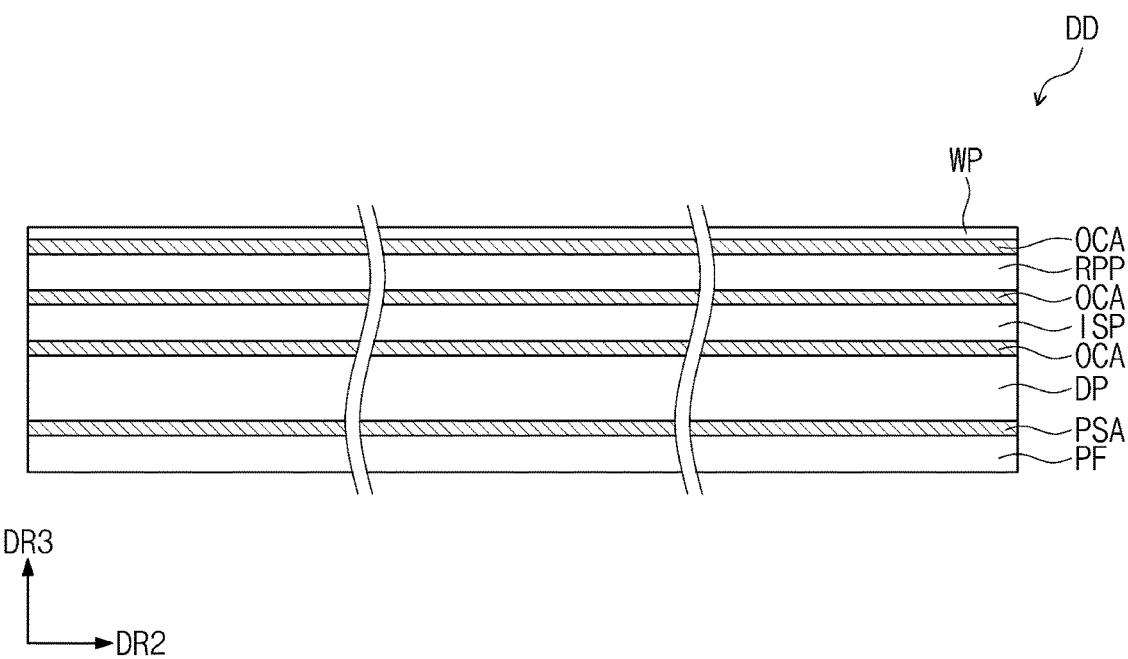

As illustrated in FIGS. 2B and 2C, the display device DD may include the display panel DP, the input sensing panel ISP, the anti-reflection panel RPP and the window panel WP. A stacking order of the input sensing panel ISP and the anti-reflection panel RPP may be changed, as illustrated in FIGS. 2B and 2C.

Figure 2D:
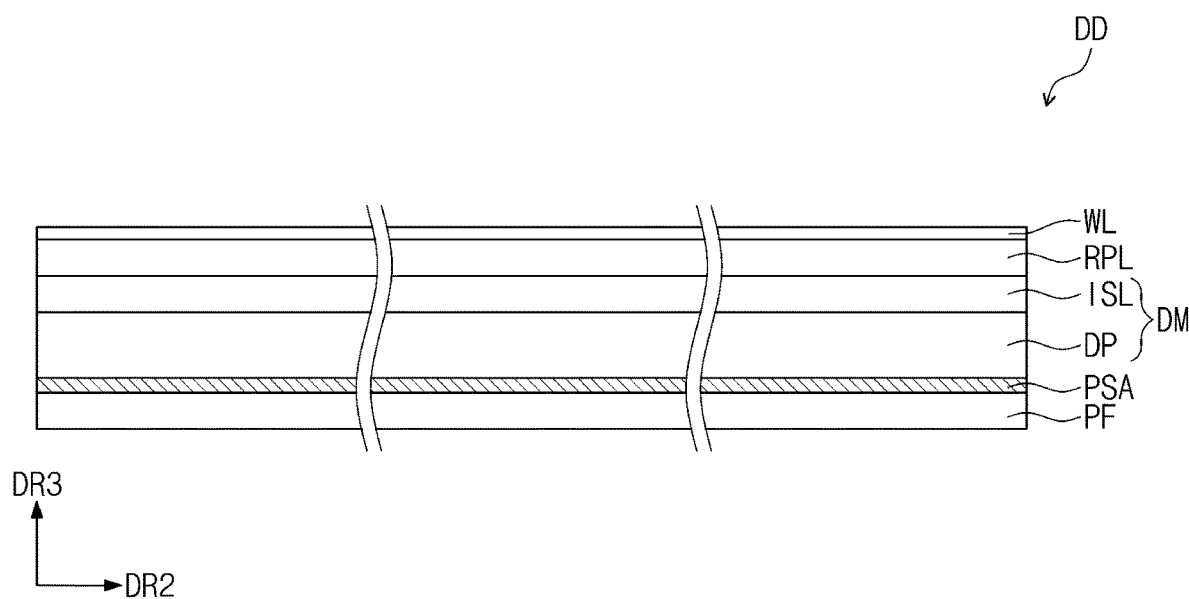

As illustrated in FIG. 2D, the display device DD may include the display panel DP, the input sensing layer ISL, the anti-reflection layer RPL and the window layer WL. Separate coupling members may be omitted from the display device DD, such that the input sensing layer ISL, the anti-reflection layer RPL and the window layer WL may be sequentially provided or formed on a base surface provided by the display panel DP through continuous processes in a method of manufacturing the display device DD. A stacking order of the input sensing layer ISL and the anti-reflection layer RPL may be changed from the order shown in FIG. 2D.

Figure 2E:
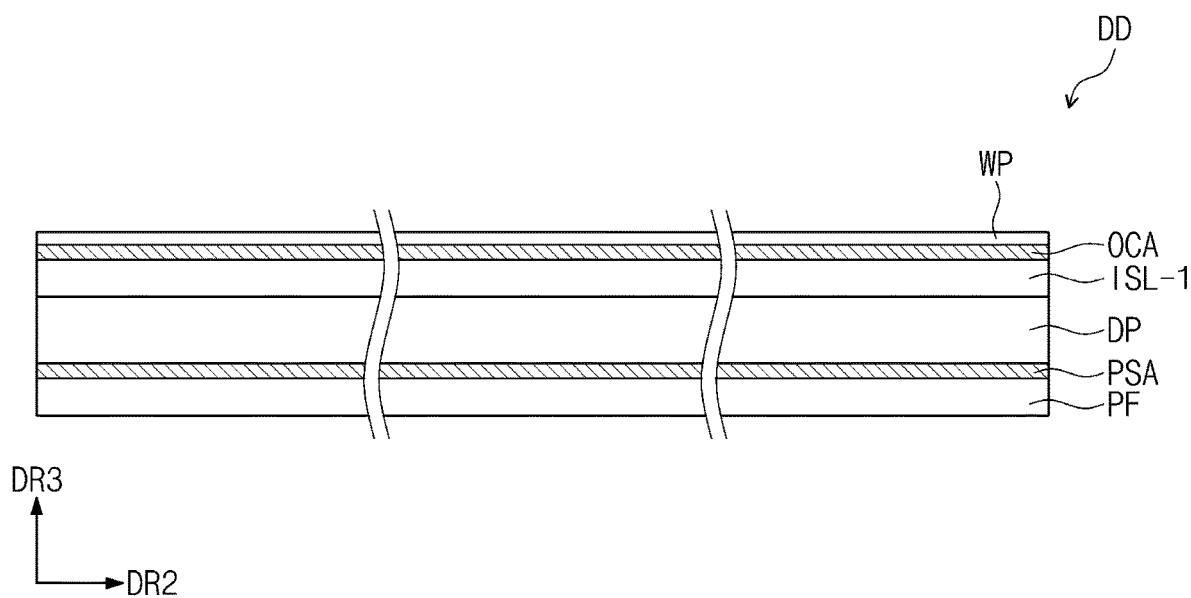
Figure 2F:
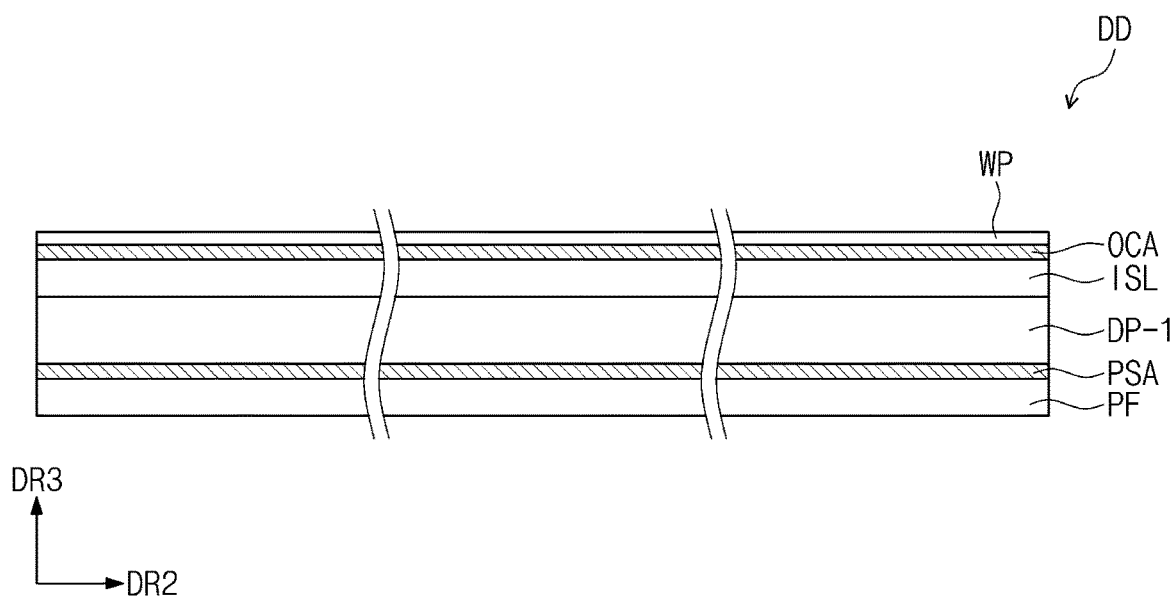

As illustrated in FIGS. 2E and 2F, the display device DD may not include a separate anti-reflection unit.

As illustrated in FIG. 2E, the display device DD may include the display panel DP, an input sensing member ISL-1 and the window panel WP. Unlike the input sensing panel ISP or the input sensing layer ISL of FIGS. 2A to 2D, the input sensing member ISL-1 according to the present embodiment may further have an anti-reflection function.

As illustrated in FIG. 2F, the display device DD may include a display panel member DP-1, the input sensing layer ISL and the window panel WP. Unlike the display panel DP of FIGS. 2A to 2E, the display panel member DP-1 according to the present embodiment may further have an anti-reflection function.

In FIGS. 2A to 2F, the input sensing unit completely overlaps with the display unit as the display panel DP or the display panel member DP-1. As illustrated in FIG. 2A, the input sensing unit may overlap with an entirety of the display area DD-DA.

However, in other embodiments, the input sensing unit may overlap with only a portion of the display area DD-DA or may overlap with only the non-display area DD-NDA. The input sensing unit may be a touch sensing panel for sensing an external contact such as from a user or may be a fingerprint sensing panel for sensing fingerprint information of a user. A pitch of sensing electrodes of the input sensing unit and/or widths of the sensing electrodes may be changed depending on the purpose of use of the input sensing unit. The sensing electrodes of the touch sensing panel may have widths of several millimeters (mm) to several tens of mm, and the sensing electrodes of the fingerprint sensing panel may have widths of several tens of μm to several hundreds of μm.

Figure 3:
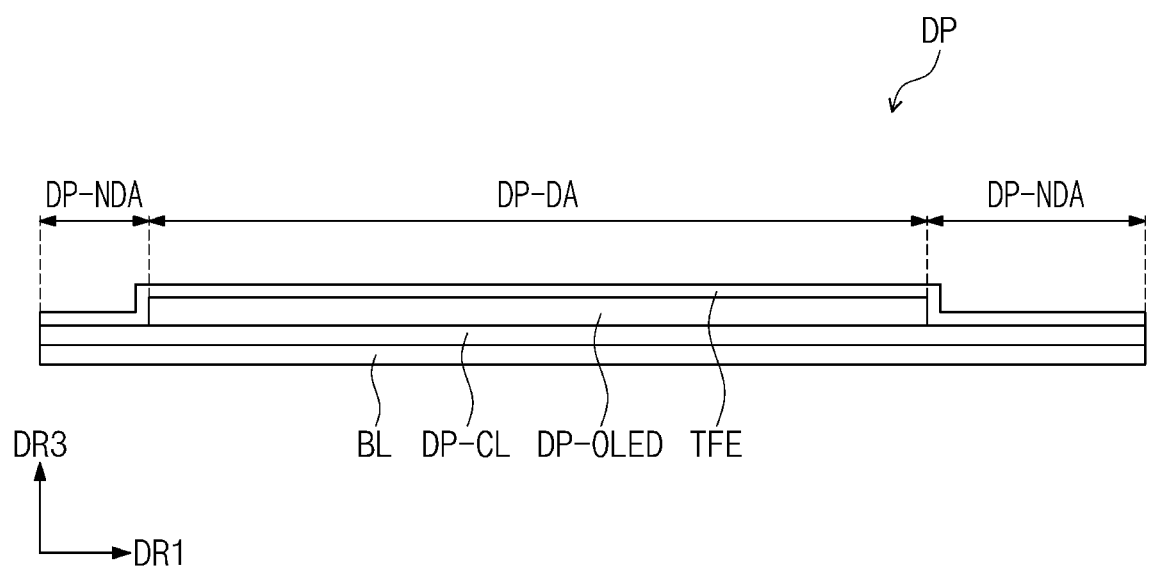
FIG. 3 is a cross-sectional view illustrating an embodiment of a display panel.

FIG. 3 is a cross-sectional view illustrating an embodiment of a display panel DP. The display panel DP described hereinafter may be applied to each display device DD described with reference to FIGS. 2A to 2F.

As illustrated in FIG. 3, the display panel DP may include a base layer BL, a circuit element layer DP-CL, a display element layer DP-OLED, and an encapsulation member such as a thin film encapsulation layer TFE. The circuit element layer DP-CL, the display element layer DP-OLED and the thin film encapsulation layer TFE may be disposed on the base layer BL. Even though not shown in the drawings, the display panel DP may further include at least one functional layer such as an anti-reflection layer and/or a refractive index adjusting layer.

The base layer BL may include a synthetic resin film. A synthetic resin layer may be provided or formed on a work substrate used when the display panel DP is manufactured. Thereafter, a conductive layer and an insulating layer may be formed on the synthetic resin layer. When the work substrate is removed, the synthetic resin layer may correspond to the base layer BL. The synthetic resin layer may be a polyimide-based resin layer. However, the invention is not limited to a kind of the material of the synthetic resin layer. In other embodiments, the base layer BL may include a glass substrate, a metal substrate or an organic/inorganic composite material substrate. In an embodiment, for example, the base layer BL may correspond to a polyimide ("PI") substrate. In an embodiment, the protective film PF may be adhered to a bottom surface of the base layer BL through the adhesive member PSA.

The circuit element layer DP-CL may include at least one insulating layer and a circuit element. Hereinafter, the insulating layer included in the circuit element layer DP-CL is referred to as an intermediate insulating layer. The intermediate insulating layer may include at least one intermediate inorganic layer and at least one intermediate organic layer. The circuit element may include a signal line and a driving circuit of a pixel. The circuit element layer DP-CL may be provided or formed through processes of provided or forming the insulating layer, a semiconductor layer and a conductive layer by coating and/or deposition methods and processes of patterning the insulating layer, the semiconductor layer and the conductive layer by using photolithography processes, in a method of manufacturing the display panel DP.

The display element layer DP-OLED may include a light emitting element. The display element layer DP-OLED may include an organic light emitting diode OLED. The display element layer DP-OLED may further include an organic layer such as a pixel defining layer PDL.

The thin film encapsulation layer TFE may encapsulate the display element layer DP-OLED. The thin film encapsulation layer TFE may include at least one insulating layer. The thin film encapsulation layer TFE include at least one inorganic layer (hereinafter, referred to as an encapsulation inorganic layer). The thin film encapsulation layer TFE may include at least one organic layer (hereinafter, referred to as an encapsulation organic layer) and at least one encapsulation inorganic layer.

The encapsulation inorganic layer may protect the display element layer DP-OLED from moisture/oxygen, and the encapsulation organic layer may protect the display element layer DP-OLED from a foreign material such as dust particles. The encapsulation inorganic layer may include at least one of, but not limited to, a silicon nitride layer, a silicon oxynitride layer, a silicon oxide layer, a titanium oxide layer and an aluminum oxide layer. The encapsulation organic layer may include, but not limited to, an acrylic-based organic layer.

Figure 4:
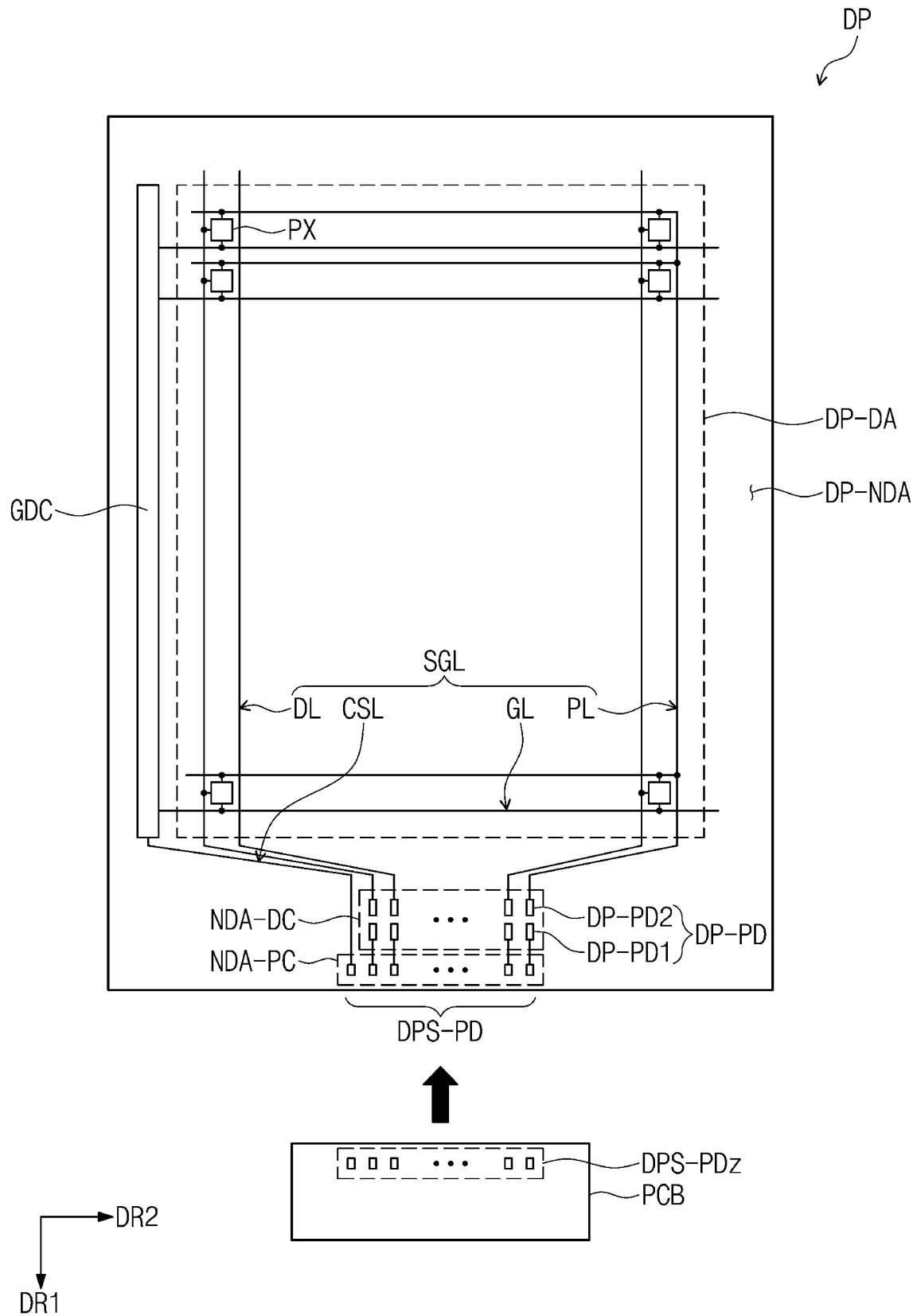
FIG. 4 is a top plan view illustrating an embodiment of a display panel.

FIG. 4 is a top plan view illustrating an embodiment of a display panel DP.

Referring to FIG. 4, the display panel DP may include a driving circuit GDC, a plurality of signal lines SGL, a plurality of signal pads DP-PD, a plurality of first connection pads DPS-PD, and a pixel PX provided in plural (e.g., a plurality of pixels PX). The pixels PX may be disposed in a display area DP-DA. Each of the pixels PX may include an organic light emitting diode OLED and a pixel driving circuit which is connected to the organic light emitting diode OLED. The driving circuit GDC, the signal lines SGL, the signal pads DP-PD, the first connection pads DPS-PD and the pixel driving circuit may be included in the circuit element layer DP-CL illustrated in FIG. 3.

The driving circuit GDC may include a scan driving circuit. The scan driving circuit may generate a plurality of scan signals and may sequentially output the scan signals to a scan line GL provided in plural (e.g., a plurality of scan lines GL) to be described below. The scan driving circuit may further output other control signals to the pixel driving circuits of the pixels PX.

The scan driving circuit may include a plurality of thin film transistors provided or formed by a same process (e.g., a low-temperature polycrystalline silicon ("LTPS") process or a low-temperature polycrystalline oxide ("LTPO") process) as the pixel driving circuits of the pixels PX.

The signal lines SGL may include the plurality of scan lines GL, a data line DL provided in plural (e.g., a plurality of data lines DL), a power line PL provided in plural (e.g., a plurality of power lines PL), and a control signal line CSL. Each of the scan lines GL may be connected to a corresponding one of the pixels PX, and each of the data lines DL may be connected to a corresponding one of the pixels PX. The power lines PL may be connected to the pixels PX. The control signal line CSL may provide control signals to the scan driving circuit.

The signal lines SGL may overlap with the display area DP-DA and a non-display area DP-NDA. Each of the signal lines SGL may include a pad portion and a line portion. The line portion may overlap with the display area DP-DA and the non-display area DP-NDA. The pad portion may be connected to an end of the line portion. The pad portion may be disposed in the non-display area DP-NDA and may overlap with a corresponding one of the signal pads DP-PD.

Hereinafter, an area of the non-display area DP-NDA, in which the signal pads DP-PD are disposed, may be defined as a chip area NDA-DC. Another area of the non-display area DP-NDA, in which the first connection pads DPS-PD are disposed, may be defined as a first pad area NDA-PC.

According to an embodiment, a driving chip DC through which electronic signals are provided to the display panel DP from outside the display panel DP, may be mounted on the chip area NDA-DC. The signal pads DP-PD may be electrically connected to the driving chip DC to transmit electrical signals received from the driving chip DC to the signal lines SGL. That is, the electrical signals may be transmitted from the non-display area DP-NDA to the display are DP-DA, via the signal lines SGL.

In an embodiment, the signal pads DP-PD may include a first signal pad DP-PD1 provided in plural (e.g., first signal pads DP-PD1) and arranged along the second direction DR2 to constitute a first row of signal pads, and a second signal pad DP-PD2 provided in plural (e.g., second signal pads DP-PD2) and arranged along the second direction DR2 to constitute a second row of signal pads. The first row and the second row are arranged along the first direction DR1. However, the invention is not limited thereto. In an embodiment, the signal pads DP-PD may be arranged along the first direction DR1 to constitute a single row.

A portion of a circuit board PCB may be disposed corresponding to the first pad area NDA-PC. The first connection pads DPS-PD may be electrically connected to the circuit board PCB to transmit electrical signals received from the circuit board PCB to the signal pads DP-PD. The circuit board PCB may be rigid or flexible. In an embodiment, for example, when the circuit board PCB is flexible, a flexible printed circuit board may be used as the circuit board PCB.

The circuit board PCB may include a timing control circuit for controlling operations of the display panel DP. The timing control circuit may be mounted on the circuit board PCB in the form of an integrated chip. In addition, even though not shown in the drawings, the circuit board PCB may include an input sensing circuit for controlling the input sensing unit.

The circuit board PCB may include second connection pads DPS-PDz electrically connected to the display panel DP. That is, the circuit board PCB is electrically connectable to the display panel DP at the second connection pads DPS-PDz. The second connection pads DPS-PDz may be disposed in a second pad area defined in the circuit board PCB. The second pad area may correspond to the first pad area NDA-PC of the display panel DP. The second connection pads DPS-PDz of the circuit board PCB may be electrically bonded to the first connection pads DPS-PD of the display panel DP. In an embodiment, for example, the first connection pads DPS-PD and the second connection pads DPS-PDz may be electrically connected to each other through an anisotropic conductive film or may be in direct contact with each other by an ultrasonic bonding method to be electrically connected. That is, the display panel DP is electrically connectable to the circuit board PCB at the first connection pads DPS-PD.

Figure 5:
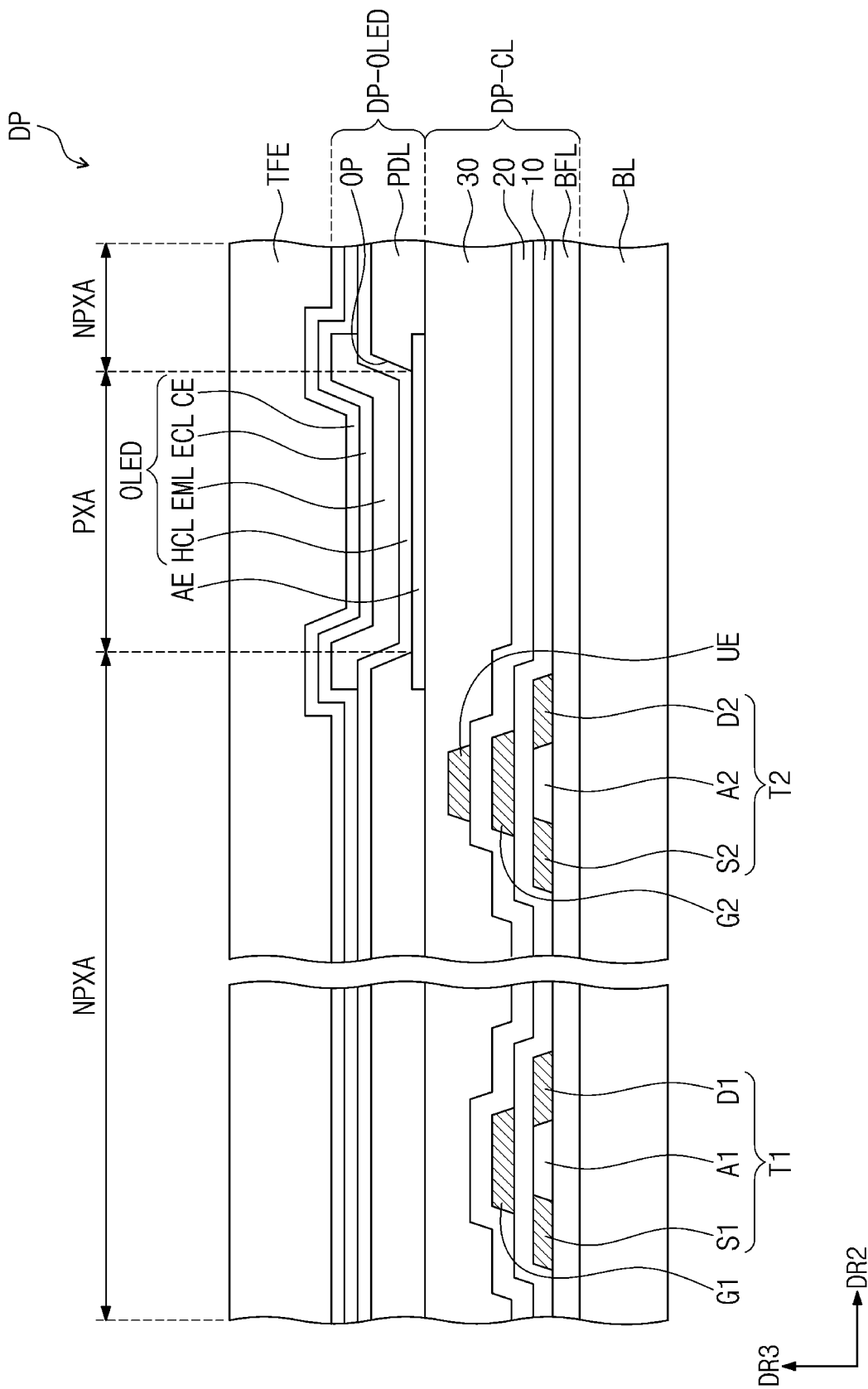
FIG. 5 is an enlarged cross-sectional view illustrating an embodiment of a display panel.

FIG. 5 is an enlarged cross-sectional view illustrating an embodiment of a display panel DP.

Referring to FIG. 5, the display panel DP may include a plurality of insulating layers, semiconductor patterns, conductive patterns and signal lines SGL. The insulating layer, a semiconductor layer and a conductive layer may be provided or formed by coating and deposition processes within a method of manufacturing the display panel DP. Thereafter, the insulating layer, the semiconductor layer and the conductive layer may be selectively patterned using photolithography processes within the method of manufacturing the display panel DP. The semiconductor patterns, the conductive patterns and the signal lines SGL which are included in the circuit element layer DP-CL and the display element layer DP-OLED may be provided or formed by these processes.

The base layer BL may include a synthetic resin film. The synthetic resin layer may include a thermosetting resin. The base layer BL may have a multi-layered structure. In an embodiment, for example, the base layer BL may have a three-layer structure of a synthetic resin layer, an adhesive layer and a synthetic resin layer arranged along a thickness direction. In particular, the synthetic resin layer may be a polyimide-based resin layer. However, the invention is not limited to a kind of the material of the synthetic resin layer. The synthetic resin layer may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, and a perylene-based resin. In other embodiments, the base layer BL may include a glass substrate, a metal substrate, or an organic/inorganic composite material substrate.

At least one inorganic layer may be provided or formed on a top surface of the base layer BL. The inorganic layer may include at least one of aluminum oxide, titanium oxide, silicon oxide, silicon oxynitride, zirconium oxide, and hafnium oxide. The inorganic layer may have a multi-layered structure. The multi-layered inorganic layer may include a barrier layer and/or a buffer layer BFL. In the present embodiment, the display panel DP may include a buffer layer BFL.

The buffer layer BFL may improve a coupling strength between the base layer BL and the semiconductor patterns. The buffer layer BFL may include a silicon oxide layer and a silicon nitride layer. The silicon oxide layer and the silicon nitride layer may be stacked along the thickness direction.

The semiconductor patterns may be disposed on the buffer layer BFL. The semiconductor patterns may include polysilicon. However, the invention is not limited thereto. In embodiments, the semiconductor patterns may include amorphous silicon or a metal oxide.

FIG. 5 illustrates various semiconductor patterns in a pixel PX. However, another semiconductor pattern may further be disposed in an area of the pixel PX different from that shown in FIG. 5, in a plan view. The semiconductor patterns may be various arranged throughout the pixels PX. Electrical characteristics of the semiconductor pattern may be changed depending on a doping characteristic of the semiconductor pattern. The semiconductor pattern may include a doped region and a non-doped region. The doped region may be doped with N-type dopants or P-type dopants. A P-type transistor may include the doped region doped with the P-type dopants.

As illustrated in FIG. 5, a first source S1 (e.g., source region), a first active region A1 and a first drain D1 (e.g., drain region) of a first transistor T1 may be provided or formed from in semiconductor pattern, and a second source S2, a second active region A2 and a second drain D2 of a second transistor T2 may be provided or formed in another semiconductor pattern. The source S1 or S2 and the drain D1 or D2 may extend from a respective active region A1 or A2, in opposite directions to each other when viewed in a cross-sectional view.

A first insulating layer 10 may be disposed on the buffer layer BFL. The first insulating layer 10 may overlap with the plurality of pixels PX (see FIG. 4) in common and may cover the semiconductor patterns. The first insulating layer 10 may include an inorganic layer and/or an organic layer and may have a single-layered structure or multi-layered structure. The first insulating layer 10 may include at least one of aluminum oxide, titanium oxide, silicon oxide, silicon oxynitride, zirconium oxide, and hafnium oxide. In the present embodiment, the first insulating layer 10 may be a single-layered silicon oxide layer. Like the first insulating layer 10, each of the following insulating layers of the circuit element layer DP-CL may include an inorganic layer and/or an organic layer and may have a single-layered or multi-layered structure. Here, the inorganic layer may include at least one of the materials described above.

A first gate G1 (e.g., gate electrode) and a second gate G2 (e.g., gates G1 and G2) may be disposed on the first insulating layer 10. The gates G1 and G2 may be portions of a same metal material layer or metal pattern. The gates G1 and G2 may overlap with the active regions A1 and A2, respectively. The gates G1 and G2 may be used as masks in a process of doping the semiconductor patterns, in a method of manufacturing the display panel DP.

A second insulating layer 20 may be disposed on the first insulating layer 10 to cover the gates G1 and G2. The second insulating layer 20 may overlap with the pixels PX (see FIG. 4) in common. The second insulating layer 20 may include an inorganic layer and/or an organic layer and may have a single-layered or multi-layered structure. In the present embodiment, the second insulating layer 20 may be a single-layered silicon oxide layer.

An upper electrode UE may be disposed on the second insulating layer 20. The upper electrode UE may overlap with the second gate G2 of the second transistor T2. The upper electrode UE may be a portion of a metal pattern. A portion of the second gate G2 and the upper electrode UE which overlap with each other may define a capacitor. In another embodiment, the upper electrode UE may be omitted.

A third insulating layer 30 may be disposed on the second insulating layer 20 and may cover the upper electrode UE. In the present embodiment, the third insulating layer 30 may be a single-layered silicon oxide layer.

As illustrated in FIG. 5, the display area DP-DA may include a light emitting area PXA and a non-light emitting area NPXA which is adjacent to the light emitting area PXA. The non-light emitting area NPXA may surround the light emitting area PXA in the top plan view. In the present embodiment, the light emitting area PXA is defined corresponding to a partial area of a first electrode AE, which is exposed through an opening OP of a pixel defining layer PDL.

A hole control layer HCL may be disposed in common in the light emitting area PXA and the non-light emitting area NPXA. The hole control layer HCL may include a hole transfer layer and may further include a hole injection layer. An emission layer EML may be disposed on the hole control layer HCL. The emission layer EML may be disposed in an area corresponding to the opening OP. In other words, the emission layers EML of the pixels PX may be separated from each other.

An electron control layer ECL may be disposed on the emission layer EML. The electron control layer ECL may include an electron transfer layer and may further include an electron injection layer. The hole control layer HCL and the electron control layer ECL may be provided or formed in common across the plurality of pixels PX, such as by using an open mask in a method of manufacturing the display panel DP. A second electrode CE may be disposed on the electron control layer ECL. The second electrode CE may have a single unitary body shape and may be disposed in common along the plurality of pixels PX (see FIG. 4).

Figure 6A:
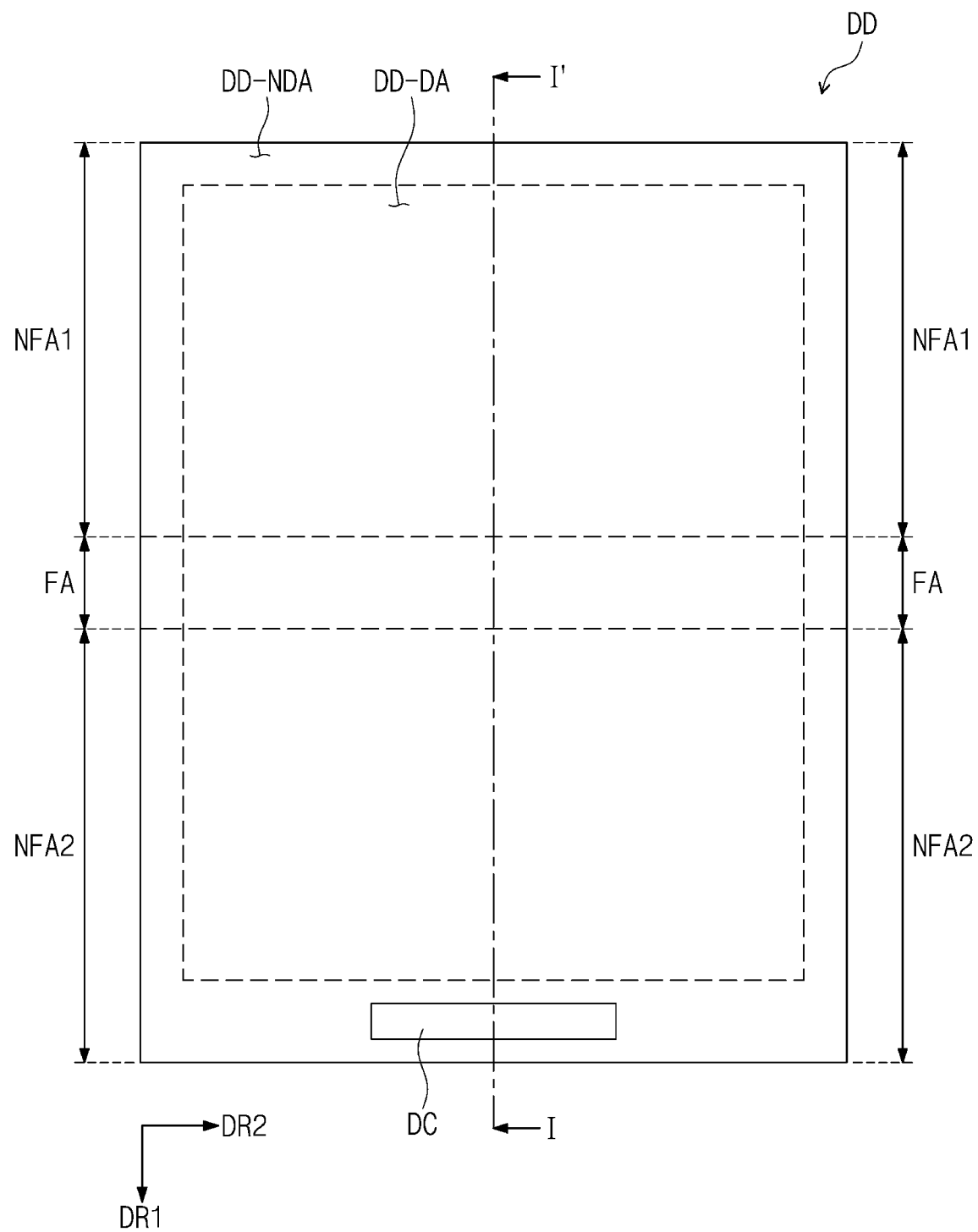
FIGS. 6A to 6C are views illustrating embodiments of a display device.
Figure 6B:
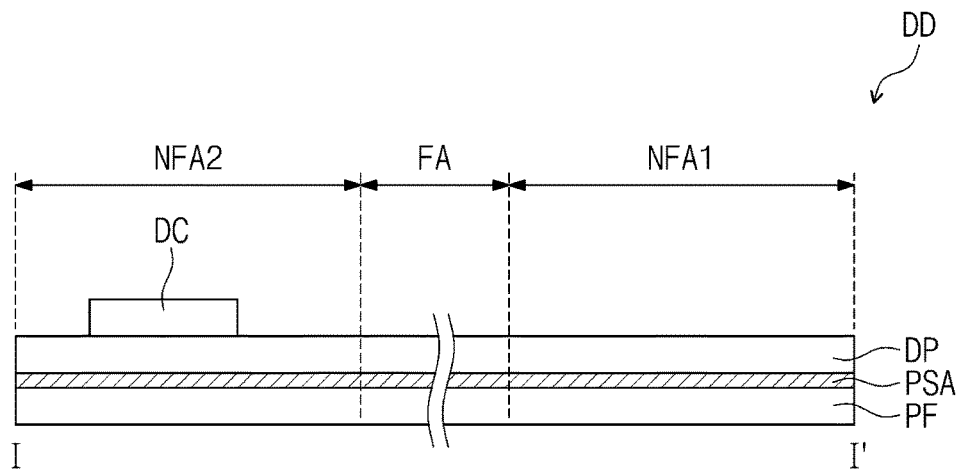
Figure 6C:
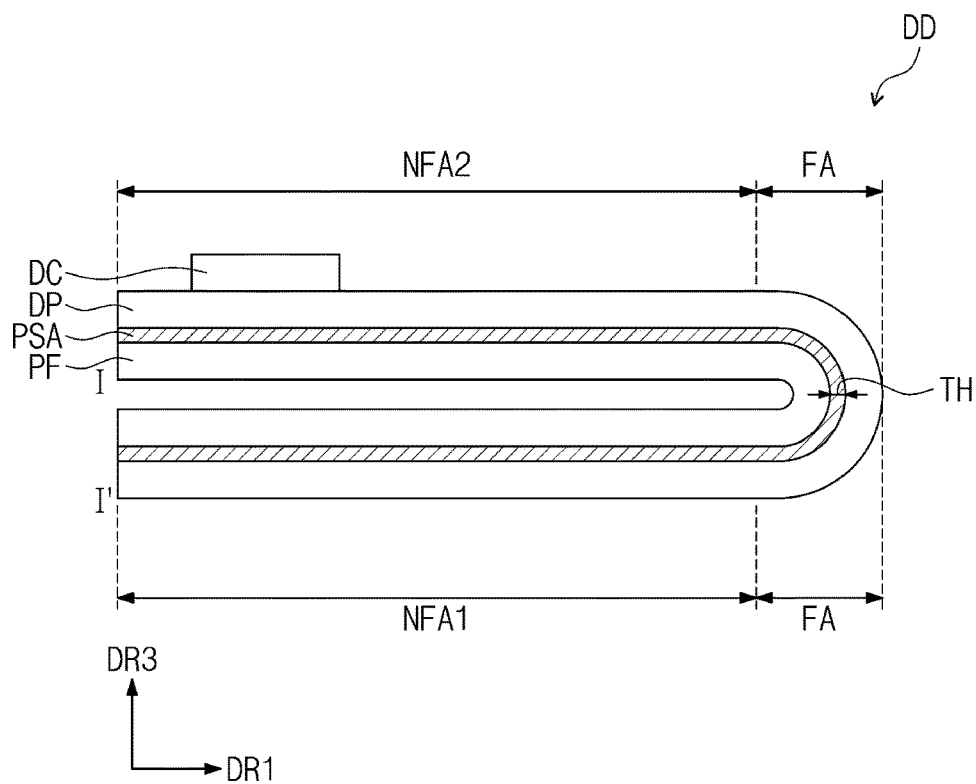

FIGS. 6A to 6C are views illustrating embodiments of a display device DD.

FIG. 6A is a top plan view of a display device DD. FIG. 6B is a cross-sectional view taken along line I-I' of FIG. 6A and illustrates the display device DD which is unfolded. FIG. 6C illustrates the display device DD which is folded.

Referring to FIG. 6A, the display device DD may include a display area DD-DA for displaying an image and a non-display area DD-NDA which is adjacent to the display area DD-DA in a top plan view. The display device DD which is unfolded disposes a first non-folding area NFA1, a folding area FA and a second non-folding area NFA2 in order along the first direction DR1. In an embodiment, the display device DD may correspond to a display device DD may be foldable when the first non-folding area NFA1, the folding area FA and the second non-folding area NFA2 are defined in the display device DD. The display device DD which is foldable has the folding area FA is illustrated in FIG. 6A. However, the display device DD is not limited to a display device DD which is foldable. In embodiments, the display device DD may be applied to a display device DD which is rigid (e.g., non-foldable) or various flexible kinds of the display device DD.

The display device DD may include a driving chip DC. The driving chip DC may be disposed in the non-display area DD-NDA. In detail, the driving chip DC may be disposed in the non-display area DD-NDA at the second non-folding area NFA2. The driving chip DC may be mounted directly on the display panel DP of the display device DD. The driving chip DC may correspond to an electronic component for transmitting driving signals to the display panel DP. In an embodiment, for example, the driving chip DC may generate driving signals as electronic signals which are used for operation of the display panel DP based on control signals transmitted from outside the display panel DP. The driving chip DC may provide electronic signals to the display panel DP from the circuit board PCB outside the display panel DP. The driving chip DC may provide electronic signals for controlling the pixels PX (see FIG. 4) of the display panel DP.

The driving chip DC may be electrically connected to the display panel DP by an ultrasonic bonding method. The driving chip DC may be mounted on the display panel DP by one of various mounting methods. In an embodiment, for example, the mounting method may be a chip-on-glass ("COG") method of directly adhering the driving chip DC on a rigid glass substrate of the display panel DP, a chip-on-film ("COF") method of adding another flexible film to the display panel DP, or a chip-on-plastic ("COP") method of directly adhering the driving chip DC to a flexible display panel. In an embodiment, the driving chip DC may be adhered directly to the display panel DP by the COP method. In the present embodiment, the display panel DP may include flexible polyimide ("PI").

Referring to FIGS. 6B and 6C, the display device DD may include the display panel DP, a protective film PF disposed under the display panel DP, and an adhesive member PSA disposed between the display panel DP and the protective film PF and coupling these components to each other. The protective film PF may be disposed on the bottom surface of the polyimide substrate of the display panel DP. In an embodiment, the protective film PF may include or be formed of polyimide ("PI"). In an embodiment, for example, the protective film PF may include clear or transparent polyimide. The adhesive member PSA may include an acrylic-based compound (e.g., may include acrylic or an acrylic material). In an embodiment, for example, the acrylic-based compound may include at least one of butyl acrylate, ethyl acrylate, and acrylic acid. The adhesive member PSA may include a pressure sensitive adhesive. A thickness TH of the adhesive member PSA may range from about 15 μm to about 18 μm. The thickness TH of a portion of the adhesive member PSA may be determined in a normal direction with respect to a surface from which the portion of the adhesive member PSA is extended. The thickness TH may be defined at each of the folding area FA and the non-folding area.

In an embodiment, when the thickness TH of the adhesive member PSA ranges from about 15 μm to about 18 μm, a thickness of the display panel DP may range from about 35 μm to about 40 μm (in particular, may be about 37 μm). A thickness of the protective film PF may range from about 47 μm to about 52 μm (in particular, may be about 50 μm).

In FIGS. 6B and 6C, the adhesive member PSA may adhere the display panel DP and the protective film PF to each other at the first non-folding area NFA1, the second non-folding area NFA2 and the folding area FA. The display panel DP, the protective film PF and the adhesive member PSA may be folded or unfolded at the folding area FA.

TABLE 1

| Pressure (MPa) | PSA Thickness (μm) | | | | | |
| --- | --- | --- | --- | --- | --- | --- |
| | 15 | | 18 | | 25 | |
| | Failure/ Input | Failure rate (%) | Failure/ Input | Failure rate (%) | Failure/ Input | Failure rate (%) |
| 39 | 0F/5 | 0% | 1F/5 | 25% | 4F/10 | 40% |

Table 1 shows the probability of failure in the folding area FA of the display device DD according to the thickness of the adhesive member PSA. In Table 1, for an experiment, the pressure of 39 megapascals (MPa) is higher than usual. Table 1 may show the probability of separation of the protective film PF from the display panel DP according to the thickness TH of the adhesive member PSA. For example, when the display device DD is unfolded (FIG. 6B) or folded (FIG. 6C), the display panel DP and the protective film PF may be unfolded or folded together. The protective film PF may be separated from the display panel DP at the folding area FA.

In Table 1, when the thickness TH of the adhesive member PSA is 25 µm, 4 samples among inputted 10 samples are failed (4F/10). When the thickness TH of the adhesive member PSA is 15 µm, failure (e.g., separation) is not shown in the folding areas FA of all of inputted samples (0F/5). In Table 1, it may be recognized that an optimal thickness TH of the adhesive member PSA, which does not cause failure in the folding area FA of the display device which is foldable, is 15 µm.

However, if the thickness TH of the adhesive member PSA is too small, other failures different from the separation failure in the folding area FA, which is not shown Table 1, may be caused. In an embodiment, for example, failure related to adhesive strength may be caused in the first and second non-folding areas NFA1 and NFA2. In the present embodiment, the display device DD may include the adhesive member PSA having the thickness TH of 15 µm to 18 µm.

TABLE 2

|  | Ref model | Application review model PSA Thickness (µm) | | | | |
| --- | --- | --- | --- | --- | --- | --- |
|  | 25 | 25 | 18 | 15 | 13 | 10 |
| Strain (%) | 0.092 | 0.080 | 0.095 | 0.105 | 0.113 | 0.132 |

Table 2 shows a strain in percent (%) of a reference model (Ref model) and strains (%) of application review models. Each of the application review models includes the adhesive member PSA applied to the display device DD according to one or more embodiment of the invention which corresponds to the display device DD having the COP structure.

The thicknesses TH of the adhesive members PSA of the application review models are different from each other. The reference model has a strain of 0.092% when a thickness TH of its adhesive member PSA is 25 µm. When the display device DD according to an embodiment includes the adhesive member PSA having the thickness TH of 15 µm, the strain of the display device DD is 0.105%. When the display device DD according to an embodiment includes the adhesive member PSA having the thickness TH of 18 µm, the strain of the display device DD is 0.095%.

In other words, the strain of 15 µm to 18 µm has the smallest deviation from the strain of the reference model. Referring again to Table 2, for example, the deviation of the strain of 18 µm from the strain of the reference model is less than the deviation of the strain of 15 µm from the strain of the reference model. In other words, the feature of Table 2 is different from the feature of Table 1 in which the failure rate is the smallest when the thickness TH of the adhesive member PSA is 15 µm. When a thickness of the adhesive member PSA is too large (e.g., 25 µm) or too small (e.g., 10 µm), the strain of the display device DD has a significant deviation from the strain of the reference model.

Referring to FIG. 6C, for example, the display device DD which is folded at the folding area FA, disposes the adhesive member PSA between the display panel DP and the protective film PF and having a thickness TH of about 15 µm to about 18 µm at the folding area FA.

The display device DD according to one or more embodiment may include the adhesive member PSA which is disposed between the display panel DP and the protective film PF, and has the thickness TH of about 15 µm to about 18 µm. In embodiments, even though not shown in Table 1 or Table 2, the display device DD may include the adhesive member PSA having the thickness TH of about 16 µm to about 17 µm. In this case, the thickness of the protective film PF may range from about 47 µm to about 52 µm (in particular, may be about 50 µm).

Thus, one or more embodiment of the invention provide the display device DD which is foldable (or flexible) and includes the driving chip DC mounted directly on the display panel DP and in which the first non-folding area NFA1, the folding area FA and the second non-folding area NFA2 are sequentially defined along the first direction DR1. The display device DD according to one or more embodiment of the invention may include the protective film PF including or formed of polyimide, and the adhesive member PSA including the acrylic-based compound and having the thickness of about 15 µm to about 18 µm, and thus failure or defects in the folding area FA may be reduced.

According to the above descriptions, one or more embodiments may provide the display device DD for which failure (e.g., interface separation) in the folding area FA of the display device DD is reduced. According to one or more embodiment of the display device DD, the COP structure may be applied to the display device DD which is foldable or flexible while still reducing failure, especially in the folding area FA. Thus, high resolution of the display device DD may be realized, processes of manufacturing the display device DD may be simplified, and material costs may be reduced.

While the invention has been described with reference to embodiments, it will be apparent to those skilled in the art that various changes and modifications may be made without departing from the spirit and scope of the invention. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A display device comprising:
a folding area at which the display device is folded based on an axis extending in a first direction;
a non-folding area adjacent to the folding area;
a display panel including pixels, and a driving chip which is connected to the pixels and provides a control signal to the pixels for controlling the pixels, the driving chip directly mounted to the display panel;
a polyimide protective film facing the display panel; and
an adhesive member disposed between the display panel and the polyimide protective film,
wherein at least some of the pixels are disposed between the folding area and the driving chip in a second direction crossing the first direction, and
wherein the adhesive member has a thickness of about 15 micrometers to about 18 micrometers, is in direct contact with the display panel and the polyimide protective film, and couples the polyimide protective film to the display panel.

2. The display device of claim 1, wherein the adhesive member includes an acrylic material.

3. The display device of claim 2, wherein the acrylic material includes at least one of butyl acrylate, ethyl acrylate and acrylic acid.

4. The display device of claim 1, wherein the driving chip is in the non-folding area.

5. The display device of claim 4, further comprising a display area in which an image is displayed, and a non-display area adjacent to the display area,
wherein the driving chip which is in the non-folding area, is in the non-display area.

6. The display device of claim 1, wherein the adhesive member which has the thickness of about 15 micrometers to about 18 micrometers, couples the display panel and the polyimide protective film to each other at each of the non-folding area and the folding area.

7. The display device of claim 1, wherein the display panel which is coupled to the polyimide protective film by the adhesive member having the thickness of about 15 micrometers to about 18 micrometers, has a thickness which ranges from about 35 micrometers to about 40 micrometers.

8. The display device of claim 1, wherein the polyimide protective film which is coupled to the display panel by the adhesive member having the thickness of about 15 micrometers to about 18 micrometers, has a thickness which ranges from about 47 micrometers to about 52 micrometers.

9. A display device comprising:
a display panel including: pixels, and
a driving chip which is connected to the pixels and provides a control signal to the pixels for controlling the pixels, the driving chip directly mounted to the display panel;
an adhesive member including acrylic and having a thickness of about 15 micrometers to about 18 micrometers; and
a polyimide protective film disposed on the adhesive member,
wherein at least some of the pixels are disposed between a folding area and the driving chip, and
wherein the adhesive member is in direct contact with the display panel and the polyimide protective film and couples the display panel to the polyimide protective film.

10. The display device of claim 9, wherein the display panel comprises a polyimide substrate and a display element layer which is on the polyimide substrate.

11. The display device of claim 10, wherein the polyimide protective film faces the display element layer with the polyimide substrate therebetween.

12. The display device of claim 10, wherein the driving chip is directly mounted to the display panel comprising the polyimide substrate, by a chip-on-plastic structure.

13. The display device of claim 9, wherein the thickness of the adhesive member ranges from about 16 micrometers to about 17 micrometers.

14. The display device of claim 13, wherein the polyimide protective film which is coupled to the display panel by the adhesive member having the thickness which ranges from about 16 micrometers to about 17 micrometers, has a thickness which is about 50 micrometers.

15. A display device comprising:
a folding area at which the display device is folded based on an axis extending in a first direction, and a non-folding area which is adjacent to the folding area;
a display panel corresponding to the folding area and the non-folding area, the display panel including pixels, and a driving chip which is connected to the pixels and provides a control signal to the pixels for controlling the pixels, the driving chip directly mounted to the display panel;
a polyimide protective film facing the display panel at both the folding area and the non-folding area and including polyimide; and
an adhesive member disposed between the display panel and the polyimide protective film,
wherein
at least some of the pixels are disposed between the folding area and the driving chip in a second direction crossing the first direction,
the adhesive member has a thickness of about 15 micrometers to about 18 micrometers, and
the adhesive member is in direct contact with the display panel and the polyimide protective film and couples the display panel to the polyimide protective film.

* * * * *